(12) United States Patent
Archer et al.

(10) Patent No.: US 6,208,764 B1
(45) Date of Patent: Mar. 27, 2001

(54) RANK FILTER USING A LINKED-LIST TO LINK ELEMENTS IN A MEMORY ARRAY IN NUMERICAL ORDER

(75) Inventors: Greg L. Archer; Larry W. Wilkinson, both of Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/137,064

(22) Filed: Aug. 20, 1998

(51) Int. Cl.[7] .............................. G06K 9/40; G06K 9/44; G06T 5/00; G06T 5/20; G06F 17/00
(52) U.S. Cl. .................... 382/260; 382/262; 382/264; 708/300; 708/304; 708/308
(58) Field of Search ...................... 708/202, 207, 708/304, 308, 300; 382/260, 262, 264, 275

(56) References Cited

U.S. PATENT DOCUMENTS

| | | | |
|---|---|---|---|
| 4,802,108 | 1/1989 | Bagdis et al. | 708/202 |
| 4,949,389 | 8/1990 | Allebach et al. | 382/211 |
| 5,113,484 | 5/1992 | Jeong | 706/16 |
| 5,315,171 | 5/1994 | Blauer et al. | 327/71 |
| 5,319,583 | * 6/1994 | Wildes | 708/303 |
| 5,408,675 | 4/1995 | Florentino et al. | 345/334 |
| 5,532,948 | 7/1996 | Kohno et al. | 708/207 |
| 5,668,895 | 9/1997 | Yamazaki et al. | 382/260 |
| 5,708,595 | * 1/1998 | Connell | 708/211 |
| 5,737,251 | 4/1998 | Kohno et al. | 708/207 |
| 5,870,584 | * 2/1999 | Bennet | 707/3 |

OTHER PUBLICATIONS

"Algorithms C++", by Robert Sedgewick, 1992, pp. 115–119.

* cited by examiner

Primary Examiner—Scott Rogers
(74) Attorney, Agent, or Firm—Susan L. Parulski

(57) ABSTRACT

A rank filter suitable for use in real-time signal processing and image processing applications, for example, for improving an image. The rank filter can be implemented in software or hardware, employed in single- and multi-dimensions, and within any specified window. A link-list algorithm is combined with a memory array for storing and ordering the data.

12 Claims, 9 Drawing Sheets

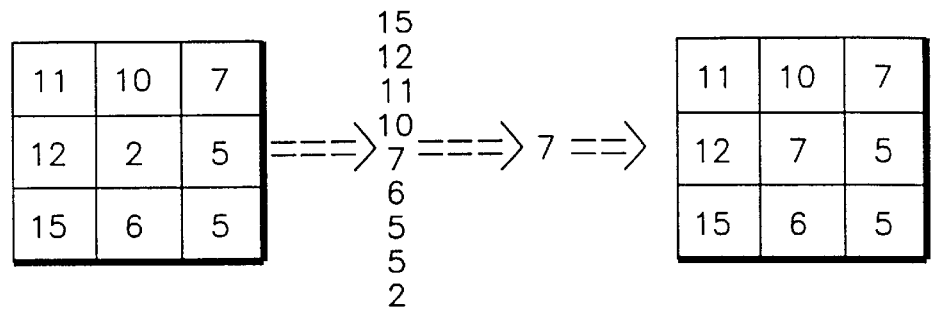
FIG. 1
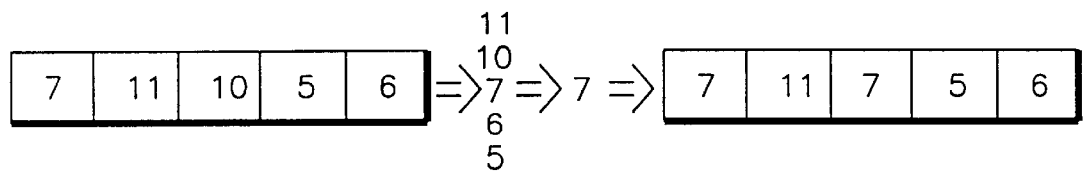
FIG. 2
(1, 9, 6, 7, 5)
FIG. 3

|   | $E_2$ |   | $E_3$ |   | $E_4$ |   |   |   |
|---|---|---|---|---|---|---|---|---|
| 0 | $E_2$ | $E_1$ | $E_3$ | $E_2$ | $E_4$ | $E_3$ | $E_5$ | $E_4$ | 0 |
| 0 |   | 0 |   | 0 |   | 0 |   | 0 |

| 0 | $E_2$ | 0 | $E_3$ | $E_2$ | $E_4$ | $E_3$ | $E_5$ | $E_4$ | 0 |
|---|---|---|---|---|---|---|---|---|---|
| 0 | | 0 | | 0 | | 0 | | 0 |

FIG. 7(b)

| 0 | $E_2$ | 0 | $E_3$ | $E_2$ | $E_4$ | $E_3$ | $E_5$ | $E_4$ | 0 |
|---|---|---|---|---|---|---|---|---|---|
| 1 | | 0 | | 0 | | 0 | | 0 |

FIG. 7(c)

| $E_5$ | 0 | 0 | $E_3$ | $E_2$ | $E_4$ | $E_3$ | $E_5$ | $E_4$ | 1 |
|---|---|---|---|---|---|---|---|---|---|
| 1 | | 0 | | 0 | | 0 | | 0 |

RANK VALUE = 7

| 0 | $E_2$ | $E_1$ | $E_3$ | $E_2$ | $E_4$ | $E_3$ | $E_5$ | $E_4$ | 0 | $\Rightarrow$ (1,9,6,7,5,8,2) |
|---|---|---|---|---|---|---|---|---|---|---|
| 0 |  |  | 0 |  | 0 |  | 0 |  | 0 | |

| $E_5$ | 0 | 0 | $E_3$ | $E_2$ | $E_4$ | $E_3$ | $E_5$ | $E_4$ | $E_1$ | $\Rightarrow$ (1,9,6,7,5,8,2) |
|---|---|---|---|---|---|---|---|---|---|---|
| 1 |  |  | 0 |  | 0 |  | 0 |  | 0 | |

FIG. 10(b)

| $E_5$ | $E_2$ | $E_1$ | 0 | 0 | $E_4$ | $E_3$ | $E_5$ | $E_4$ | $E_1$ | $\Rightarrow$ (1,9,6,7,5,8,2) |
|---|---|---|---|---|---|---|---|---|---|---|
| 1 |  |  | 9 |  | 0 |  | 0 |  | 0 | |

FIG. 10(c)

| $E_5$ | $E_3$ | $E_3$ | 0 | $E_1$ | $E_2$ | 0 | $E_5$ | $E_4$ | $E_1$ | $\Rightarrow$ (1,9,6,7,5,8,2) |
|---|---|---|---|---|---|---|---|---|---|---|
| 1 |  |  | 9 |  | 6 |  | 0 |  | 0 | |

FIG. 10(d)

| $E_5$ | $E_3$ | $E_4$ | 0 | $E_1$ | $E_4$ | $E_3$ | $E_2$ | 0 | $E_1$ | $\Rightarrow$ (1,9,6,7,5,8,2) |
|---|---|---|---|---|---|---|---|---|---|---|
| 1 |  |  | 9 |  | 6 |  | 7 |  | 0 | |

FIG. 10(e)

| 0 | $E_5$ | $E_4$ | 0 | $E_5$ | $E_4$ | $E_3$ | $E_2$ | $E_1$ | $E_3$ | $\Rightarrow$ (1,9,7,7,5,8,2) |
|---|---|---|---|---|---|---|---|---|---|---|
| 1 |  |  | 9 |  | 6 |  | 7 |  | 5 | |

FIG. 10(f)

| $E_4$ | $E_2$ | $E_1$ | 0 | $E_5$ | $E_4$ | $E_3$ | $E_1$ | 0 | $E_3$ | $\Rightarrow$ (1,9,7,8,5,8,2) |
|---|---|---|---|---|---|---|---|---|---|---|
| 8 |  |  | 9 |  | 6 |  | 7 |  | 5 | |

FIG. 10(g)

| $E_4$ | 0 | 0 | $E_5$ | $E_5$ | $E_4$ | $E_3$ | $E_1$ | $E_2$ | $E_3$ | $\Rightarrow$ (1,9,7,8,7,8,2) |
|---|---|---|---|---|---|---|---|---|---|---|
| 8 |  |  | 2 |  | 6 |  | 7 |  | 5 | |

FIG. 10(h)

| FILTER CHARACTERISTICS | | PROCESSING TIME (SECONDS) | |
|---|---|---|---|
| WINDOW SIZE | RANK VALUE | QUICK SORT | PRESENT INVENTION |
| 3 | 1 | 1.342 | 0.952 |
|   | 2 | 1.322 | 0.971 |
|   | 3 | 1.302 | 0.991 |
| 5 | 1 | 2.283 | 1.061 |
|   | 3 | 2.303 | 1.061 |
|   | 5 | 2.273 | 1.081 |
| 7 | 1 | 3.224 | 1.091 |
|   | 4 | 3.245 | 1.152 |
|   | 7 | 3.225 | 1.292 |
| 9 | 1 | 4.106 | 1.152 |
|   | 5 | 4.116 | 1.182 |
|   | 9 | 4.126 | 1.322 |
| 11 | 1 | 4.987 | 1.162 |
|   | 6 | 4.967 | 1.332 |
|   | 11 | 4.971 | 1.392 |
| 13 | 1 | 5.978 | 1.192 |
|   | 7 | 5.868 | 1.382 |
|   | 13 | 5.928 | 1.553 |
| 15 | 1 | 6.819 | 1.222 |
|   | 8 | 6.831 | 1.432 |
|   | 15 | 6.851 | 1.602 |
| 31 | 1 | 15.302 | 1.532 |
|   | 16 | 15.352 | 1.943 |
|   | 31 | 15.332 | 2.303 |

FIG. 12

RANK FILTER USING A LINKED-LIST TO LINK ELEMENTS IN A MEMORY ARRAY IN NUMERICAL ORDER

FIELD OF THE INVENTION

The present invention relates generally to a rank filter methodology suitable for use in real-time signal processing and image processing applications.

BACKGROUND OF THE INVENTION

Digital filtering is a class of image processing. Rank filtering is one type of digital filtering which is widely used in image processing, for example, for eliminating/reducing noise in an image. It is a technique for performing non-linear smoothing of a single- or multi-dimensional signal consisting of discrete samples.

An output sample is generated by the filter for each such input sample, using a window size and a rank value to specify the characteristics of the filter. The rank filter is a sorting algorithm in which data values (e.g., pixels) within the window are sorted in numerical order. The output value is the nth lowest data value within the window, where n is the rank order of the filter. When n is the median sample, the rank-order filter could be referred to as a median filter. More particularly, a rank filter replaces a data value, corresponding to a predetermined rank, among multiple data values within the window. The data set value corresponding to the center position of the window is replaced. Accordingly, there can only be an odd number of data values in the window since the result of the filter is stored in the location on which the window is centered.

Using two examples, the concept of a rank filter is briefly explained in order to help in understanding a rank filter. FIG. 1 shows a first example of performing a rank filtering in the case of data values within a 3×3 window. If the data values (shown at the left of the figure) are arranged starting with the largest number and ending with the smallest number, they become: 15, 12, 11, 10, 7, 6, 5, 5, 2. If a predetermined rank of 5 is selected, the data position corresponding with the center position of the 3×3 window (which has a value of 2), is replaced with the value of 7, since 7 is the magnitude corresponding to the $5^{th}$ value (i.e., rank of 5) of the nine data values (as shown at the right of the figure). For this particular example, since the value of 7 is a median value of the nine data values, the filter could be referred to as a median filter.

FIG. 2 shows a second example of performing a rank filter in a case of data values within a 5×1 window. If the data values (shown at the left of the figure) are arranged starting with the largest number and ending with the smallest number, they become: 11, 10, 7, 6, 5. If a predetermined rank of 3 is selected, the data position corresponding with the center position of the 5×1 window (which has a value of 10), is replaced with the value of 7, since 7 is the magnitude corresponding to the 3rd value (i.e., rank of 3) of the five data values. The ranked data values are shown at the right of the figure.

Numerous designs exist in the prior art for both one-dimensional and two-dimensional rank filters. U.S. Pat. No. 5,408,675 is directed to a hardware implementation of a programmable rank order filter using a first-in-first-out approach to track the values and the rank number for each corresponding value. U.S. Pat. No. 5,315,171 determines the rank value by the summation from comparator of the inputs to the feedback value. U.S. Pat. No. 5,113,484 determines the rank element by comparing in order the rank desired with occurrences of each possible value.

While such apparatus may have achieved certain degrees of success in their particular applications, because of the constant sorting of the data value in the window, the processing of an image using this technique can be compute intensive. In addition, memory requirements to perform the filtering may require space for both the original image and the processed image. Further, such filtering may be limited to a particular window size or rank element, or require that the filter be implemented solely in hardware or solely in software.

Accordingly, a need continues to exist for a rank filter which does not consume significant processing time, is not limited to a particular window size or rank element, does not require significant computer memory, and can be implemented in both hardware and software.

SUMMARY OF THE INVENTION

An object of the present invention is to provide a rank filter which does not consume significant processing time.

Another object of the invention is to provide such a rank filter which is not limited to a particular window size or rank element.

Still another object of the invention is to provide such a rank filter which does not require significant computer memory.

Yet another object of the invention is to provide such a rank filter which can be implemented in both hardware and software.

These objects are given only by way of illustrative example. Thus, other desirable objectives and advantages inherently achieved by the disclosed invention may occur or become apparent to those skilled in the art. The invention is defined by the appended claims.

According to one aspect of the invention, there is provided a method for performing a rank filter. A predetermined target rank n is selected. A memory array of a predetermined window size s is generated, as is a linked-list linking the elements of the memory array. The target rank n is selected as being less than or equal to the window size s. After initializing each element of the memory array, a data value from a data set is sequentially inputted into the memory array. Each time a data value is sequentially inputted into the memory array, it is compared with the data values of the elements of the memory array, and inserted into the linked-list so as to be in numerical order. Accordingly, after the data values have been inserted, the linked-list links the elements within the memory array in numerical order. The rank value of the memory array is returned and replaces a value in the data set corresponding to the center of the window.

According to another aspect of the invention, there is provided a rank filter. The rank filter includes a memory array of a predetermined window size s. A predetermined target rank n is selected so as to be less than or equal to the window size s. A linked-list links the elements of the memory array. Input means sequentially inputs a data value from a data set into the memory array, while filtering means performs numerical ordering of the data values contained within the memory array each time a data value is inputted into the memory array. The rank filter further includes means for updating the linked-list after the data values have been filtered such that the linked-list links the elements disposed within the memory array in numerical order. Means replacing a data value of the data set with the rank value are also included.

The present invention provides a rank filter which does not consume significant processing time, is not limited to a particular window size or rank element, does not require significant computer memory, and can be implemented in both hardware and software.

BRIEF DESCRIPTION OF THE DRAWINGS

The foregoing and other objects, features, and advantages of the invention will be apparent from the following more particular description of the preferred embodiments of the invention, as illustrated in the accompanying drawings.

FIG. 1 shows a first example generally illustrating the performing of a rank filter in the case of data values within a 3×3 window.

FIG. 2 shows a second example generally illustrating the performing of a rank filter in the case of data values within a 5×1 window.

FIG. 3 shows a pixel data set of a first example.

FIGS. 7(a)–7(d) shows, in sequence, the insertion of a data value into a linked-list.

FIG. 9 shows a pixel data set of a second example.

FIGS. 10(a)–10(h) show, in sequence, a rank filter of the pixel data set of FIG. 9.

FIG. 12 shows time comparisons between the rank filter in accordance with the present invention and a rank filter employing a quicksort algorithm.

DETAILED DESCRIPTION OF THE INVENTION

Figure 4A:
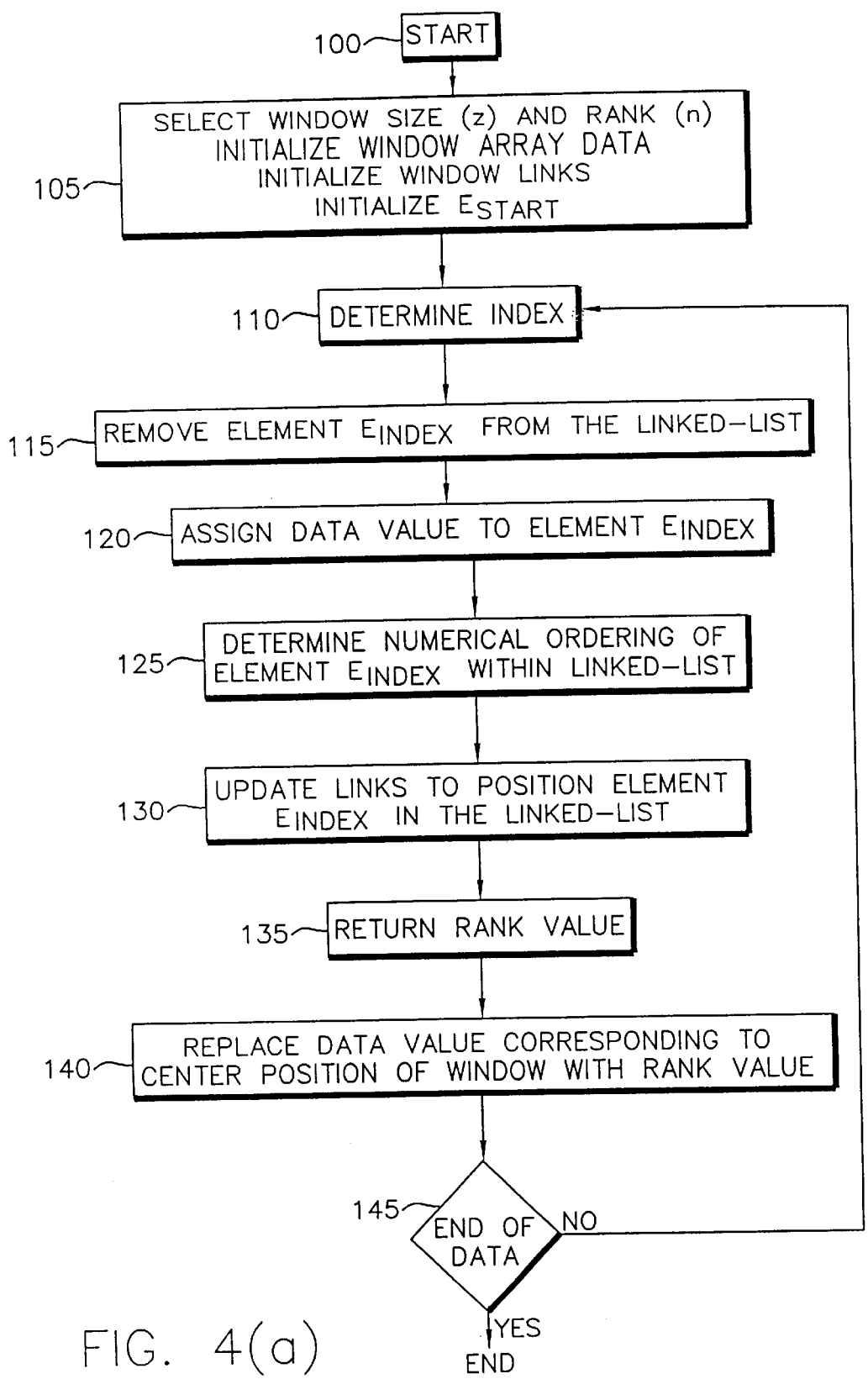
FIGS. 4(a) through 4(c) show flowcharts describing the rank filter in accordance with the present invention.

The following is a detailed description of the preferred embodiments of the invention, reference being made to the drawings in which the same reference numerals identify the same elements of structure in each of the several figures.

Those skilled in the art will recognize that rank filters can be implemented using dedicated hard-wired circuitry or software. For ease of discussion, the rank filter of the present invention is generally described utilizing a software implementation. However, the rank filter of the present invention can be implemented using hardware. Further, as those skilled in the art will recognize, the present invention is suitable for single- and multi-dimensional windows.

As mentioned above, the rank filter of the present invention is suitable for use in real-time signal processing. However, for ease of discussion, the rank filter of the present invention will be discussed in terms of the processing of an image. Accordingly, the data values representing the image will hereinafter be referred to as pixels.

Generally, the rank filter of the present invention eliminates the need to sort the pixels within the window. For a single-dimensional window, a memory array is employed which is equal in size to the window size. The memory array and a linked-list algorithm are used to store and order the pixels within the window. The memory array is used to store each pixel and an index is used to determine the next element of the memory array to be replaced by the next pixel of the data set. The linked-list algorithm keeps the pixel data in order and determines the output of the filter. Accordingly, the index throws out only the data value which is no longer to be contained and adds the new pixel value. The throwing out of the old pixel and the adding of the new pixel occurs as the window shifts one pixel. That is, for a single-dimensional filter, only one pixel value is sorted for each shift of the window. As such, the present invention provides a rank filter which is not compute intensive and requires minimal computer memory to perform the rank filter operation. Computational steps are reduced since the only updating required is the value of the new pixel added (to the data set) and the corresponding links of the linked-list for the new value. The linked-list algorithm tracks what the next and previous pixel are, so that when the oldest pixel is determined, the linked-list is quickly updated by referencing the previous to the next and viceversa. A copy (in temporary memory) of the entire pixel data set is not required for the present invention. Rather, for a one-dimensional filter, only sufficient memory to store pixels in the window is required. A two-dimensional filter requires a memory array having a size equal to the second dimension of the window size multiplied by the first dimension of the image size. The original pixel data set is updated with the resulting rank value.

The present invention is now more particularly described through an illustration of a first example of a single-dimensional window. The pixel data set to be filtered is shown in FIG. 3, and includes five values (in order): 1, 9, 6, 7, 5.

Referring now to FIG. 4(a), a window rank filter size z and a rank n are predetermined (step 100). For this particular example, a window size of 5 and a rank of 4 are selected. Accordingly, a memory array having a size equivalent to the window size is generated and initialized (step 105). Each of the five memory array elements $E_1, E_2, E_3, E_4, E_5$ may be initialized to any value. For this particular example, each of the memory array elements are initialized to zero. A linked-list starting marker $E_{start}$ is initialized to element $E_1$ (step 105), indicating that the memory array element $E_1$ contains the lowest numerical value of the values disposed within the memory array, and thus, the starting location for traversing the linked-list.

Figure 5:
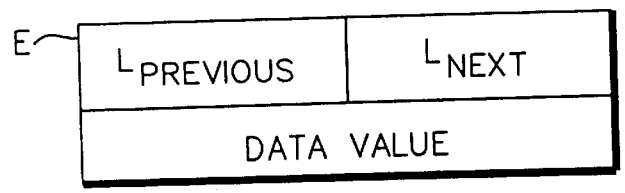
FIG. 5 represents, for illustrative purposes, a single memory array element, showing the data value, and the corresponding links for the linked-list.
Figure 6:
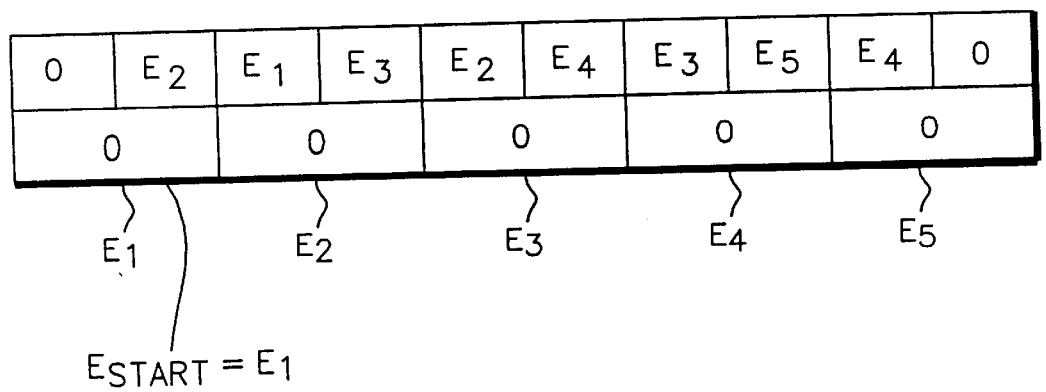
FIG. 6 represents, for illustrative purposes, an initialized memory array for the example of FIG. 3

A linked-list linking the elements of the array is generated and initialized (step 105). While linked-lists are known to those skilled in the art, the linked-list of the present invention employs a bi-directional link (i.e., a two directional pointer). That is, each element of the memory array has two associated links; one link is directed to the element having the next higher numerical value and the other link is directed to the element having the next lower numerical value. This bi-directional linking associated with an element is generally illustrated in FIG. 5 by a single element and its corresponding linked-list. As illustrated in FIG. 5, each memory array element has a data value, a link to a previous array element $L_{previous}$, and a link to a next array element $L_{next}$. FIG. 6 illustrates the initialized memory array and its corresponding linked-list. For example, as illustrated in FIG. 6, memory array element $E_2$ has a data value equal to zero, links to previous element $E_1$ (i.e., $L_{E2previous} = E_1$), and links to next element $E_3$ (i.e., $L_{E2next} = E_3$). Note that for the particular example, since all the elements are initialized to zero, there is no "higher" or "lower" value, therefore the links are directed to the adjacent elements as illustrated in FIG. 6.

Note also that for first array element $E_1$, the link to the previous element $L_{E1previous}$ is zero since the element $E_1$ is the starting location for the linked-list (i.e., $E_{start}$). Similarly, for the last memory array element $E_5$, the link to the next element $L_{E5next}$ is zero since it is the ending location for the linked-list.

As noted above, $E_{start}$ is the starting location for the traversing of the linked-list. Thus, $E_{start}$ is the element in the window whose link $L_{previous}$ is zero/null. As illustrated in FIG. 6, Element $E_1$ is currently identified as $E_{start}$. The element identified as $E_{start}$ may vary through the rank filter process.

The values of the pixels from the pixel data set are inputted into the memory array, one element at a time (steps 110–145). To cycle through the memory array, an Index can be used (step 110). Those skilled in the art will recognize various methods by which to index, thereby indicating the "oldest" memory array element $E_{Index}$ which is to be updated. One suitable method is to employ, a "mod" function which returns a remainder value. For example:

Index=(data number) mod (window size).

To insert a pixel data into the memory array, the two links ($L_{previous}$ and $L_{next}$) to the indexed element $E_{Index}$ are broken, thereby removing the indexed element from the linked-list (step 115) and allowing the linked-list to be maintained without the indexed element. To accomplish this removal from the linked-list, the links to the indexed element are removed and the links to the remaining memory array element are updated. For example, when element $E_1$ is to be inputted into the memory array, the links to element $E_1$ are broken. FIGS. 7(a)–7(d) illustrate the removal of element $E_1$ from the linked-list by replacing $L_{E2previous}$ of element $E_2$ with zero (i.e., $L_{E1previous}$). The removal is accomplished by resetting the links so that the link of the previous element links to the next link. As such, as illustrated in FIG. 7(b), $L_{E2previous}$ is changed from $E_1$ to zero. Consequently, the linked-list is maintained without element $E_1$ (shown by the shading of element $E_1$). Note that element $E_{start}$ is now identified as element $E_2$.

With element $E_1$ removed from the linked-list, a value from the data set is placed into element $E_1$ (step 120). As illustrated in FIG. 7(c), the pixel value of 1 replaces the data value 0 in element $E_1$.

Figure 4B:
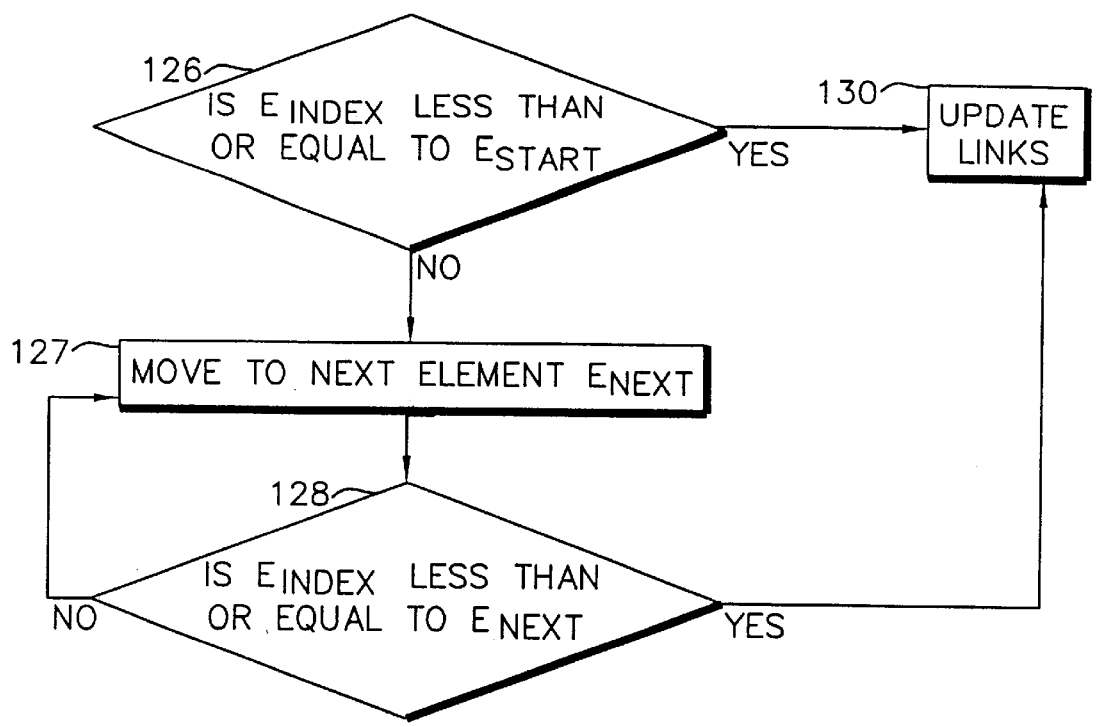

The numerical position of the indexed element within the linked-list is then determined (step 125) by inserting the data value into the memory array and numerically order the data values. That is, the data value of element $E_1$ is compared with the data values disposed within the remaining elements of the array, starting from element $E_{start}$. This numerical ordering is shown in FIG. 4(b) by steps 126–128. If equal to or lower than the value of the element (step 126), the links are updated (step 130). If greater than the value of the element, the data value is compared to the data value of the next element (steps 127–128). For the particular example, data value of 1 is first compared to the data value disposed in element $E_{start}$ which is equal to $E_2$.

Figure 4C:
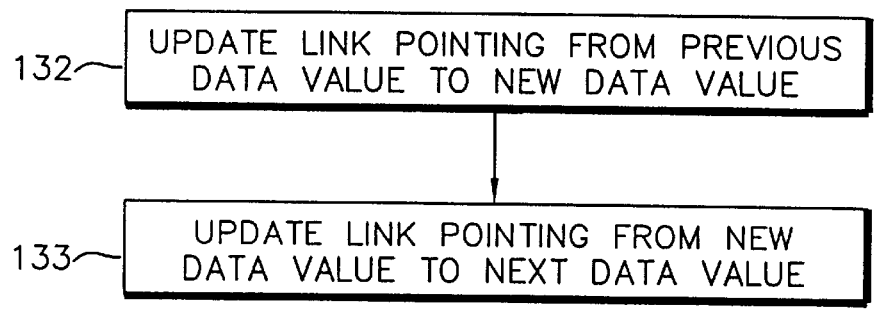

When the position of the data value within the linked-list is determined, the links are updated/reset (step 130) to reinsert the element into the linked-list. Referring to FIG. 4(c), this is accomplished by updating $L_{previous}$ and $L_{next}$ for the memory array element (steps 132 and 133). For example, to reinsert memory array element $E_1$ into the linked-list, $L_{E5next}$ is changed from zero to $E_1$, $L_{E1previous}$ is set to $E_5$, and $L_{E1next}$ is set to zero (FIG. 7(d)).

A rank value is then returned (step 135) utilizing the linked-list. Those skilled in the art will recognize various methods to return the rank value. One suitable method is to traverse the linked-list for n links (n being the rank) starting from $E_{start}$, and return the data value pointed to by the $n^{th}$ link. More particularly, the array is traversed for n links from element $E_{start}$, where n is the rank value, and the data value of the corresponding element is returned.

The data value corresponding to the center position of the window is replaced with the rank value (step 140). Those skilled in the art will recognize that it may be preferable to not implement step 140 until the center of the window corresponds to a valid pixel location (i.e., a valid image location). Stated alternatively, it may be preferable to implement step 140 after all the elements in the memory array have been loaded with a data value from the pixel data set. Those skilled in the art will recognize that this is an artifact at boundaries of an image. Generally, a user may "pad" the image borders with a particular pixel value. For Applicant's particular example, step 140 is not implemented until all the data values of the data set have been loaded into the memory array.

Since there are additional data values in the data set, steps 110–140 are repeated for the remaining data values of the data set. FIGS. 8(b)–8(f) show the data values 1, 9, 6, 7, and 5 being input into elements $E_1$, $E_2$, $E_3$, $E_4$, and $E_5$, respectively, of the initialized memory array shown in FIG. 8(a). As each is inputted, the data values are numerically ordered.

Figures 8A, 8B, 8C, 8D, 8E, 8F, 8G:
FIGS. 8(a)–8(g) show, in sequence, a rank filter of the pixel data set of FIG. 3.

For the particular example, a rank value is returned after all five data values have been inputted into the memory array (FIG. 8(g) and step 135). As discussed above, the array can be traversed for n links from element $E_{start}$, where n is the rank value, and the pixel value of the corresponding element would be returned. For the particular example illustrated in FIGS. 8(a)–8(f), the rank value is 4 and $E_{start}$ is $E_1$. Thus, the $4^{th}$ linked element from $E_1$ is $E_4$, which has a value of 7 (FIG. 8(g)). Accordingly, the pixel corresponding to the center position of the window replaced with the rank value (step 140). For this particular example, the center position has a value of 6. Consequently, the resulting pixel data set is: 1, 9, 7, 7, 5.

This example illustrates that the present invention provides a rank filter which is not compute intensive and requires minimal computer memory to perform the rank filter operation. Further, the computational steps are reduced since the only updating required is the value of the new pixel added (to the data set) and the corresponding links of the linked-list for the new value.

The present invention is now more particularly described through an illustration of a second example of a single-dimensional window. The pixel data set to be filtered is shown in FIG. 9, and includes seven values (in order): 1, 9,6,7,5,8,2.

Referring again to FIGS. 4(a)–4(c), a window size of 5 and a rank of 4 is first predetermined (steps 100–105). Referring to FIG. 10(a), an array equal to the size of the window rank filter is initialized. As shown in FIG. 10(a), the elements $E_1,E_2,E_3,E_4,E_5$ have been initialized with zeros. FIGS. 10(b) through 10(e) show the loading of the first 4 pixel values into the memory array (as was similarly illustrated in the previous example) according to steps 110–135. The corresponding resulting pixel data set is shown on the right-hand side of FIGS. 10(a)–10(e). As with the previous example, Applicants prefer to implement step 140 after all the memory array elements have been loaded with a data value from the data set. As such, the corresponding pixel data sets shown in FIGS. 10(a) through 10(e) correspond with the original pixel data set shown in FIG. 9.

Figure 11:
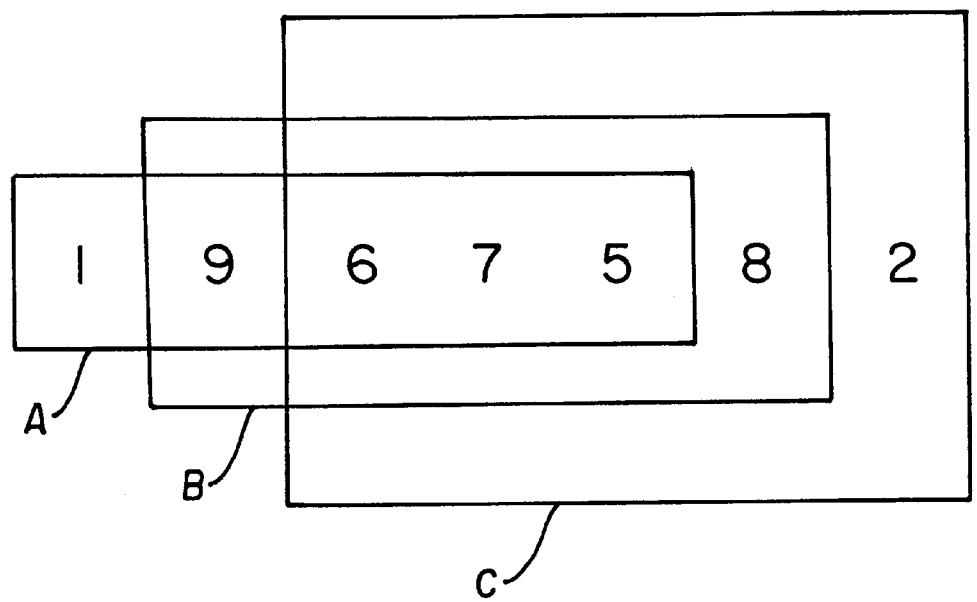
FIG. 11 shows the data of FIG. 9 illustrating the 3 sets of pixel data values being rank filtered.

When the fifth pixel value is loaded into the memory array (FIG. 10(f)), a rank value of 7 is returned at step 135 since a rank of 4 was predetermined. Box A of FIG. 11 identifies the 5 pixel data values of the pixel data set disposed in the memory array. Accordingly, the center position of the window (illustrated in FIG. 11 in Box A as the value 6), is replaced with the value 7 (step 140). As such, the resulting pixel data set, shown in FIG. 10(f), becomes: 1,9,7,7,5,8,2.

All the memory array elements contain a data value from the data set, however, there are still additional data values in the data set (step 145). Accordingly, the cycle (steps 110–145) is repeated for the additional pixel values. The value of the Index becomes 1, and the next pixel value is loaded into element $E_1$. The pixel to be inputted into the memory array has a value 8. Therefore, as illustrated in FIG. 10(g), the value of 1 in element $E_1$ is replaced with the value of 8. Consequently, the current pixel data values disposed within the memory array are shown by Box B in FIG. 11. Specifically, the values: 8, 9, 6, 7, 5. At step 135, the $4^{th}$ rank value is determined as 8 (the ordering of the values being 5, 6, 7, 8, 9). As such, the center position of the window (having a value of 7) is replaced with the value of 8. As such, the resulting pixel data set, shown in FIG. 10(g), becomes: 1,9,7,8,5,8,2.

The cycle (steps 110–145) are again repeated for the remaining pixel in the pixel data set. The value of Index is 2 (step 110), and the remaining pixel value (having a value 2) is loaded into element $E_2$. As illustrated in FIG. 10(h), the value of 9 in element $E_2$ is replaced with the value of 2. Accordingly, the pixel data values disposed within the memory array are shown by Box C in FIG. 11. Specifically, the values: 8, 2, 6, 7, 5. At step 135, the $4^{th}$ rank value is determined as 7 (the ordering of the values being 2, 5, 6, 7, 8). The center position of the window (having a value of 5) is replaced with the value of 7. The resulting pixel data set, shown in FIG. 10(h), is: 1,9,7,8,7,8,2.

The present invention provides an advantage in that, since old values are retained in the array and do not need to be refreshed for each location, the resulting data set can be placed in the image data.

Applicants have conducted a processing time comparison for the present invention and a quicksort algorithm. Quicksort algorithms are known to those skilled in the art. For example, such a quicksort algorithm is disclosed in ALGORITHMS IN C++ by Robert Sedgewick, Addison-Wesley Publishing Company, 1992, pages 115–119. A 200 MHz Pentium was used to process a 1020×1020 pixel image of gaussian noise with a grid pattern. As illustrated in FIG. 12, the present invention processes the pixel image in less time than the quicksort algorithm, with significant reductions with a larger window size; for example, 2.303 seconds versus 15.332 seconds for a window size of 31.

Figure 13:
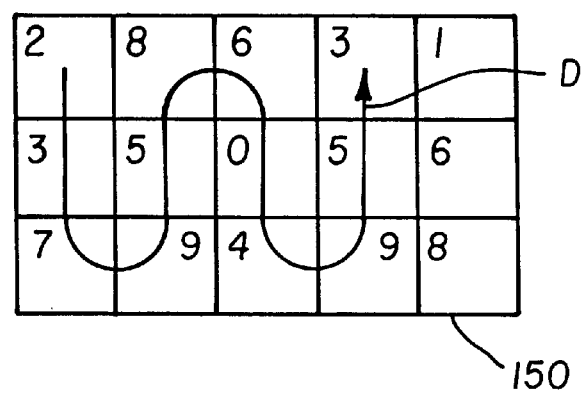
FIG. 13 illustrates the entry order for the rank filter of a multi-dimensional window.

Those skilled in the art will recognize that the present invention may be employed with a multi-dimensional window. For example, the data for each element is entered into the filter, one element at a time. When the last data is entered, the value for the center position is replaced with the rank filter result. Then, the process is repeated, and the rank re-evaluated. The multi-dimensional processing requires a temporary copy of the rows the height of the rank filter to be saved and loaded into a temporary memory since the location being modified may be used in calculating pixels less than a filter size away. More particularly, for each new row, the oldest row is replaced with a new row of data to update the temporary memory. The rank filter operates on the temporary memory and replaces the center values in the original data set (e.g., image). For example, the pixel data values are read in a snake-like winding method. Using a 3×3 window of a data set 150 illustrated in FIG. 13, the data values are read as illustrated in the figure by arrow D. The rank value result is determined at the bottom or top of every column. Stated alternatively, the data value is replaced every time a complete column is read into the window.

While the present invention has been described as being applied to numerical data values, those skilled in the art will recognize that alphanumeric characters can be assigned a numerical value according to a predetermined algorithm. For example, the letter A can be assigned a value of 1, and the letter B assigned the value of 2, etc. Thus, the rank filter of the present invention can be applied to alphanumeric characters.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

What is claimed is:

1. A method for performing a rank filter, comprising the steps of:

generating a memory array having a predetermined number of elements;

generating a linked-list linking the elements of the memory array, said linked-list comprising two links for each element of the memory array;

sequentially inputting a data value from a data set into the memory array;

numerically ordering the data values within the memory array each time a data value is sequentially inputted into the memory array;

updating the linked-list to link the elements of the memory array in numerical order each time a data value is sequentially inputted into the memory array; and returning a rank value of the memory array.

2. The method according to claim 1 further comprising the step of selecting a predetermined target rank n, the target rank n being less than or equal to the predetermined number of elements.

3. The method according to claim 2 wherein returning the rank value is accomplished by returning the $n^{th}$ rank value of the array.

4. The method according to claim 3 further comprising the step of identifying a memory array element having a data value of lowest numerical value $E_{start}$, wherein the $n^{th}$ rank value is disposed in the element n links from $E_{start}$.

5. The method according to claim 1 further comprising the step of initializing each element of the memory array.

6. The method according to claim 1 wherein the step of numerically ordering the data values within the memory array is accomplished by traversing the linked-list and comparing the inputted data value with the data values disposed in the elements of the memory array.

7. The method according to claim 1 wherein the step of numerically ordering the data values within the memory array is accomplished by traversing the linked-list and comparing the inputted data value with the data values disposed in the elements in the memory array until the inputted data value is in numerical order relative to the data values disposed in the memory array.

8. The method according to claim 1 wherein the step of sequentially inputting a data value from a data set into the memory array is accomplished by:

selecting an element $E_{select}$ into which the inputted data value is to be disposed;

removing the element $E_{select}$ from the linked-list; and updating the linked-list to link the remaining elements of the memory array.

9. The method according to claim 1 further comprising the step of replacing a value in the data set with the rank value, the replaced value in the data set corresponding to the center element of the memory array.

10. A rank filter, comprising:

a memory array having a predetermined number of elements;

a linked-list linking the elements of the memory array, said linked-list comprising two links for each element of the memory array;

input means for sequentially inputting a data value from a data set into the memory array;

comparing means for comparing the data values disposed within the memory array each time a data value is inputted so as to numerically order the data values disposed within the memory array;

means for updating the linked-list each time a data value is inputted to link the elements disposed within the memory array in numerical order; and means for returning a rank value.

11. The rank filter according to claim 10 further comprising means for replacing a data value of the data set with the rank value.

12. The rank filter according to claim 10 further comprising means for identifying a memory array element $E_{start}$ having a data value of lowest numerical value disposed within the memory array.

* * * * *